United States Patent
Liu et al.

(10) Patent No.: US 9,660,057 B2
(45) Date of Patent: May 23, 2017

(54) METHOD OF FORMING A REDUCED RESISTANCE FIN STRUCTURE

(71) Applicants: STMicroelectronics, Inc., Coppell, TX (US); International Business Machines Corporation, Armonk, NY (US); GLOBALFOUNDRIES Inc., Grand Cayman (KY)

(72) Inventors: Qing Liu, Watervliet, NY (US); Ruilong Xie, Schenectady, NY (US); Chun-chen Yeh, Clifton Park, NY (US); Xiuyu Cai, Niskayuna, NY (US); Kejia Wang, Poughkeepsie, NY (US)

(73) Assignees: STMicroelectronics, Inc., Coppell, TX (US); International Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 56 days.

(21) Appl. No.: 14/307,011

(22) Filed: Jun. 17, 2014

(65) Prior Publication Data
US 2015/0364578 A1    Dec. 17, 2015

(51) Int. Cl.
| H01L 29/66 | (2006.01) |
| H01L 29/78 | (2006.01) |
| H01L 29/20 | (2006.01) |
| H01L 29/205 | (2006.01) |

(52) U.S. Cl.
CPC ...... *H01L 29/66795* (2013.01); *H01L 29/205* (2013.01); *H01L 29/6653* (2013.01); *H01L 29/6656* (2013.01); *H01L 29/66545* (2013.01); *H01L 29/785* (2013.01); *H01L 29/20* (2013.01)

(58) Field of Classification Search
None
See application file for complete search history.

(56) References Cited

U.S. PATENT DOCUMENTS

| | | | |
|---|---|---|---|
| 2011/0147842 A1* | 6/2011 | Cappellani | H01L 21/26506 257/365 |
| 2013/0277686 A1* | 10/2013 | Liu | H01L 29/6653 257/77 |
| 2014/0322882 A1* | 10/2014 | Rodder | H01L 29/66795 438/289 |
| 2014/0367751 A1* | 12/2014 | Yu | H01L 29/785 257/288 |
| 2015/0132908 A1* | 5/2015 | Jeong | H01L 29/66795 438/283 |
| 2015/0249134 A1* | 9/2015 | Ostermaier | H01L 29/0649 257/76 |

* cited by examiner

*Primary Examiner* — Robert Carpenter
(74) *Attorney, Agent, or Firm* — Seed Intellectual Property Law Group LLP

(57) ABSTRACT

Methods and structures for forming a reduced resistance region of a finFET are described. According to some aspects, a dummy gate and first gate spacer may be formed above a fin comprising a first semiconductor composition. At least a portion of source and drain regions of the fin may be removed, and a second semiconductor composition may be formed in the source and drain regions in contact with the first semiconductor composition. A second gate spacer may be formed covering the first gate spacer. The methods may be used to form finFETs having reduced resistance at source and drain junctions.

23 Claims, 10 Drawing Sheets

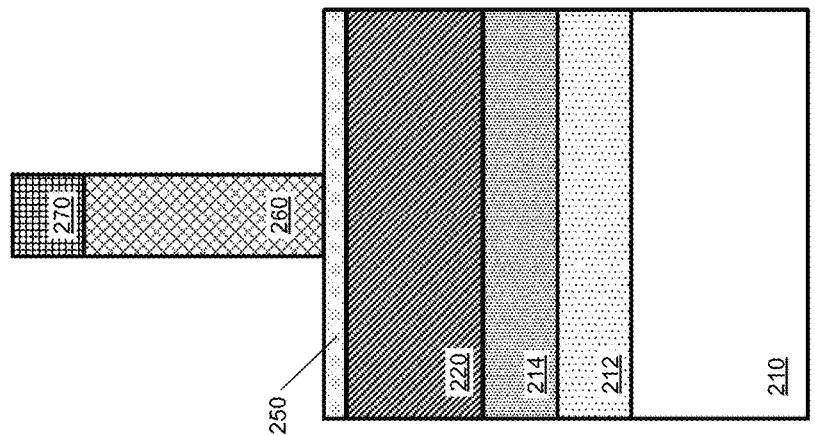
FIG. 2C
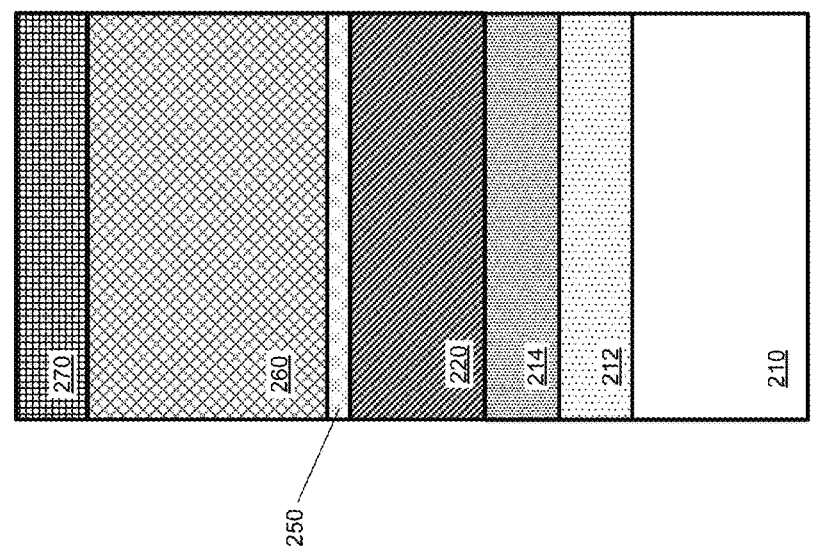
FIG. 2B
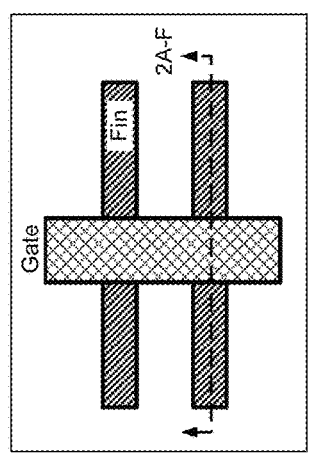
FIG. 2A'
FIG. 2A

METHOD OF FORMING A REDUCED RESISTANCE FIN STRUCTURE

BACKGROUND

Technical Field

The present application relates to methods and structures for forming reduced resistance regions of a fin structure, and can be used to form FETs exhibiting reduced resistance.

Discussion of the Related Art

Transistors are fundamental device elements of modern digital processors and memory devices, and have found numerous applications in various areas of electronics including data processing, data storage, and high-power applications. Currently, there are a variety of transistor types and designs that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and super-junction or multi-drain transistors.

Two types of transistors have emerged within the MOSFET family of transistors that show promise for scaling to ultra-high density and nanometer-scale channel lengths. One of these transistor types is a so-called fin field-effect transistor or "finFET." The channel of a finFET is formed as a three-dimensional fin that may extend from a surface of a substrate. FinFETs have favorable electrostatic properties for complimentary MOS (CMOS) scaling to smaller sizes. Because the fin is a three-dimensional structure, the transistor's channel can be formed on three surfaces of the fin, so that the finFET can exhibit a high current switching capability for a given surface area occupied on a substrate. Since the channel and device can be raised from the substrate surface, there can be reduced electric field coupling between adjacent devices as compared to conventional planar MOSFETs.

The second type of transistor is called a fully-depleted, silicon-on-insulator or "FD-SOI" FET. The channel, source, and drain of an FD-SOI FET is formed in a thin planar semiconductor layer that overlies a thin insulator. Because the semiconductor layer and the underlying insulator are thin, the body of the transistor (that lies below the thin insulator) can act as a second gate. The thin layer of semiconductor on insulator permits higher body biasing voltages that can boost performance. The thin insulator also reduces leakage current to the transistor's body region that would otherwise occur in bulk FET devices.

SUMMARY

The described technology relates to methods and structures for forming reduced resistance regions of a fin structure. In some cases, the technology may be used to form field-effect transistors with a reduced extension resistance at source and drain junctions. According to some embodiments, a reduced resistance region is formed by removing at least a portion of source and drain regions of a fin and forming a semiconductor composition in those regions. The semiconductor composition may, for example, have a higher conductivity dopant concentration than the removed portion of the fin. The resulting fin structure thereby may exhibit a reduced resistance in the source and drain regions.

According to some embodiments, a finFET may be formed by forming a dummy gate and first gate spacer above a fin, wherein the fin comprises a first semiconductor composition, and removing at least a portion of source and drain regions of the fin. A second semiconductor composition may be formed in the source and drain regions and in contact with the first semiconductor composition, and a second gate spacer may be formed covering the first gate spacer. In some embodiments, the second gate spacer extends over the second semiconductor composition. In some embodiments, at least one of the first gate spacer and the second gate spacer comprises $SiN_x$.

According to some aspects, the first semiconductor composition and/or second semiconductor composition are III-V semiconductors. In some implementations, the first semiconductor composition comprises InGaAs. In some aspects, the second semiconductor composition comprises InAs. In some implementations, the second semiconductor composition is formed by epitaxial growth.

In some implementations, the fin is formed from the first semiconductor composition. In some aspects, the first semiconductor composition is undoped.

According to some aspects, the second semiconductor composition is doped to a higher conductivity dopant concentration than the first semiconductor composition. In some implementations the second semiconductor composition has a conductivity doping concentration between $10^{18}$ dopants/$cm^3$ and $10^{21}$ dopants/$cm^3$.

In some aspects, the first gate spacer and the second gate spacer may be removed. Accordingly to some implementations, a spacer comprising a low-k dielectric, such as SiBCN and/or SiOCN, may be formed.

In some implementations, the dummy gate comprises polycrystalline silicon. Accordingly to some aspects, the dummy gate may be removed. According to some implementations, the dummy gate is formed on an oxide layer in contact with the fin, which may be removed in addition to the dummy gate. According to some aspects, a gate insulator comprising a high-k dielectric may be formed.

The foregoing aspects and implementations of acts may be included in any suitable combination in a method for forming a reduced resistance region of a finFET.

According to some embodiments, a finFET comprises a gate, one or more spacers in contact with the gate, a fin having source, channel and drain regions, and highly doped epitaxial regions of the source and drain regions extending at least partially beneath the one or more spacers.

According to some aspects, the highly doped epitaxial regions comprise a III-V semiconductor, such as InAs. In some implementations, the highly doped epitaxial regions have a doping level between $10^{18}$ dopants/cm3 and $10^{21}$ dopants/cm3. According to some aspects, the channel region comprises an undoped III-V semiconductor, such as InGaAs.

According to some implementations, the finFET further comprises a gate insulator formed of a high-k dielectric. According to some aspects, the spacer comprises a low-k dielectric, such as SiBCN and/or SiOCN.

In some implementations, the fin width is less than 20 nm. In some implementations, the finFET includes raised source and drain regions formed by epitaxial growth.

The foregoing aspects and implementations may be included in any suitable combination in one or more embodiments of a finFET.

BRIEF DESCRIPTION OF DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1A:
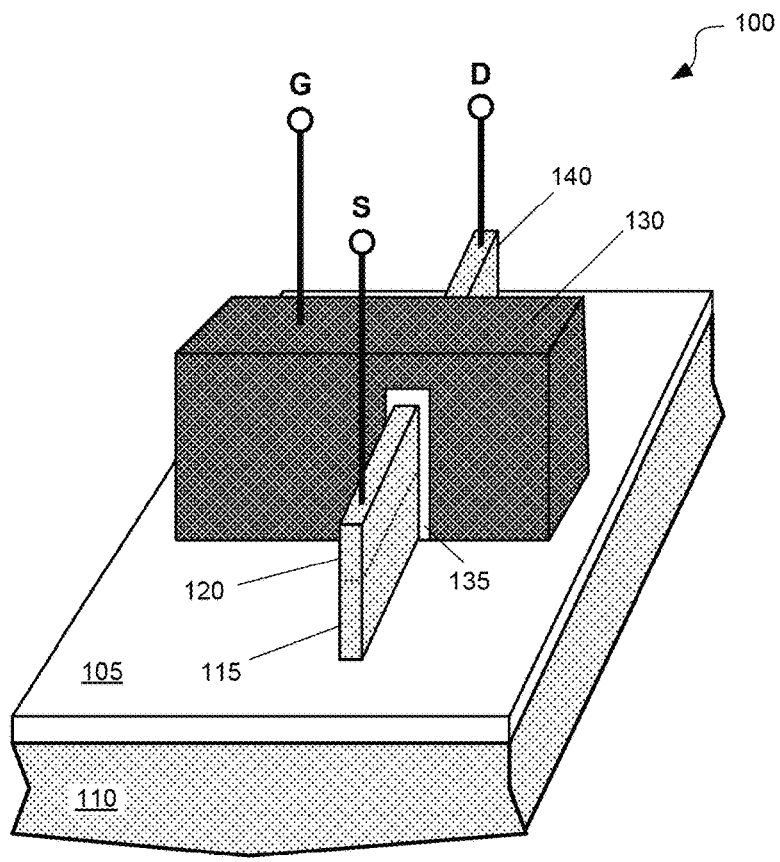
FIG. 1A is a perspective view depicting a finFET, according to some embodiments.

An example of a finFET 100 is depicted in the perspective view of FIG. 1A, according to some embodiments. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than approximately 50 nanometers. There may be an electrically-insulating layer 105, e.g., an oxide layer, on a surface of the substrate 110. The fin may pass through the insulating layer 105, but be attached to the semiconducting substrate 110 at a lower region of the fin. A gate structure comprising a conductive gate material 130 (e.g., polysilicon) and a gate insulator 135 (e.g., an oxide) may be formed over a region of the fin. The finFET may further include a source region 120 and drain region 140 adjacent to the gate. A finFET may also include integrated source S, gate G, drain D, and body B (not shown) interconnects to provide electrical connections to the source, gate, drain, and back body regions of the device.

FinFETs like those depicted in FIG. 1A exhibit favorable electrostatic properties for scaling to high-density, low-power, integrated circuits. Because the fin and channel are raised from the substrate, the devices can exhibit reduced cross-coupling between proximal devices. For the device shown in FIG. 1A, the fin 115 may be formed from the bulk substrate 110 by an etching process, and is therefore attached to the substrate at a base region of the fin, a region occluded in the drawing by the adjacent insulator 105. The insulator 105 may be formed after the etching of the fin 115. Because the fin 115 is attached to the semiconductor substrate, leakage current and cross-coupling may occur via the base region of the fin.

Figure 1B:
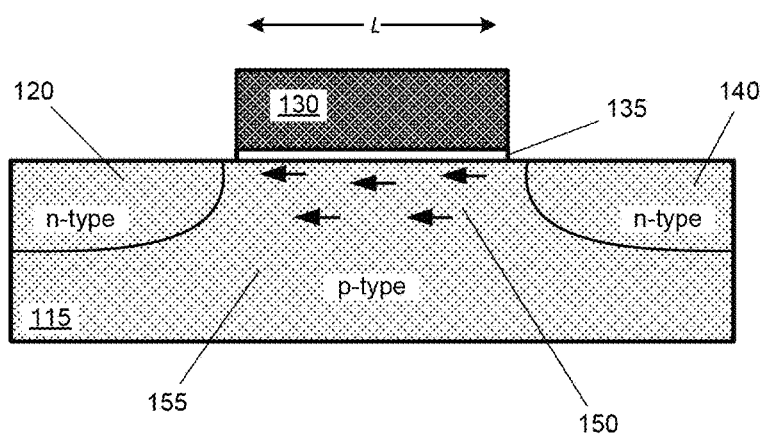
FIGS. 1B-1E depict cross-sectional views of finFET fins, according to various embodiments.
Figure 1C:
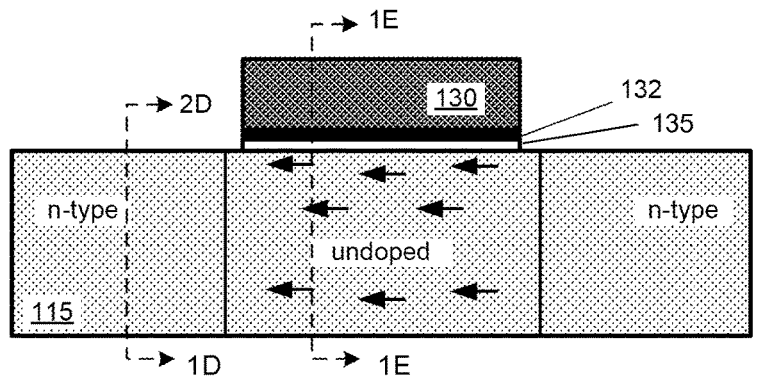

Source, channel, and drain regions of a finFET may be doped with impurities to create different regions of different conductivity types, as depicted in FIGS. 1B-1C. Several different configurations of source, channel, and drain regions are possible. According to some embodiments, source region 120 and drain region 140 may be doped to be of a first conductivity type and the channel region 150 may be doped to be of an opposite conductivity type, as depicted in FIG. 1B. The terms "source region" and "drain region" as used may include extension regions of the fins that lie between source and drain contact regions and the channel region of the finFET device.

Figure 1D:
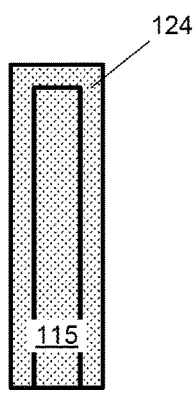

The finFET may further include a body region 155 that may be of a same conductivity type as the channel region. In some embodiments, a channel region 150 of a finFET may be undoped, as depicted in FIG. 1C. The doping of source and drain regions in a finFET may be of various geometries. As depicted in FIG. 1B, vertical portions of the fin 115 may be doped to form source 120 and drain 140 regions, according to some embodiments. Alternatively, outer sheath portions 124 of a fin 115 may be doped to form source and drain regions, as depicted in FIGS. 1C-1E.

Figure 1E:
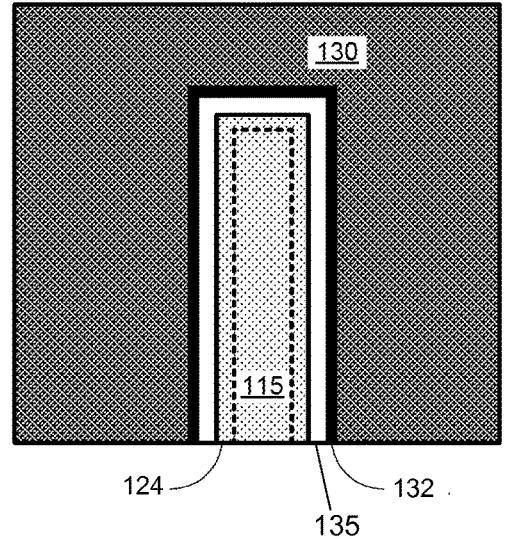

FIG. 1C and FIG. 1E depict a three-dimensional nature of a channel region 150 in a finFET, according to some embodiments. In some embodiments, the entire fin portion encased by the gate structure may be inverted and form a bulk channel rather than a surface channel. A metallic film 132 may be deposited between a gate electrode 130 and gate oxide 135 in some implementations to improve gate conductance and gate switching speeds.

The inventors have conceived of methods and structures for forming reduced resistance regions of a finFET. These methods and structures may be advantageous in use cases wherein doping of source and drain regions to the edge of the channel, such as source and drain regions 120 and 140 shown in FIG. 1B, is difficult or impossible. For example, source and/or drain regions that are fabricated, at least in part, from one or more III-V semiconductors may utilize conventional methods of doping and have limited thermal budgets that result in inadequately doped portions of the source and/or drain regions. As one example, the limited temperatures that may be applied during epitaxial regrowth of III-V semiconductors may be insufficient for adequate diffusion of dopants through source and drain regions to the edge of the channel. By instead replacing portions of the source and/or drain regions with a semiconductor composition having a higher dopant concentration than the prior source/drain regions, a doped source and/or drain region may be provided. The methods and structures described herein may thereby result in a finFET with a higher dopant concentration in source and/or drain regions, thus reducing the resistance of those regions of the finFET.

In some embodiments, a finFET having reduced source/drain junction resistance may be further formed comprising one or more dummy gates and one or more gate spacers, which are removed after addition of a doped semiconductor composition to the source and/or drain regions. Dummy gates and gate spacers may be replaced by working gates and working spacers, respectively, as subsequent steps in fabrication of the finFET. A dummy gate may, for example, aid alignment of contacts during the fabrication process and/or may allow fabrication steps to occur at higher temperatures than would otherwise be feasible with a metal gate present. In some embodiments, a gate spacer is replaced with a working spacer comprising a low-k dielectric, which may, for example, reduce the parasitic capacitance of the finFET.

Figure 2F:
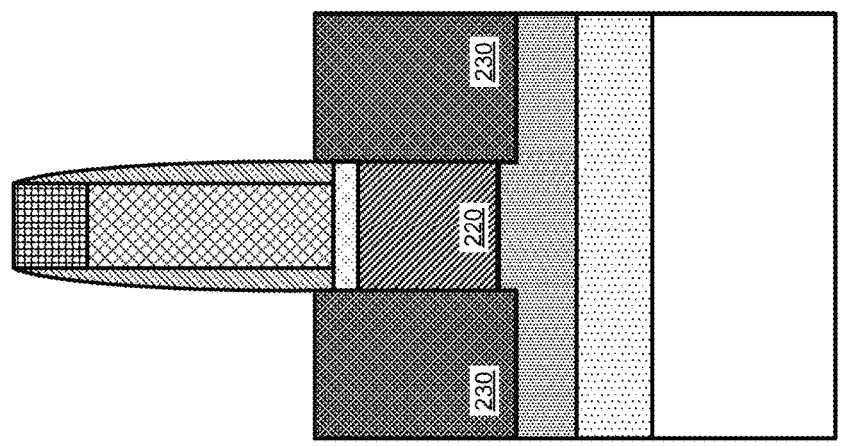
FIGS. 2A-2W depict process steps that may be used to form reduced resistance regions of a fin, according to some embodiments.
Figure 2E:
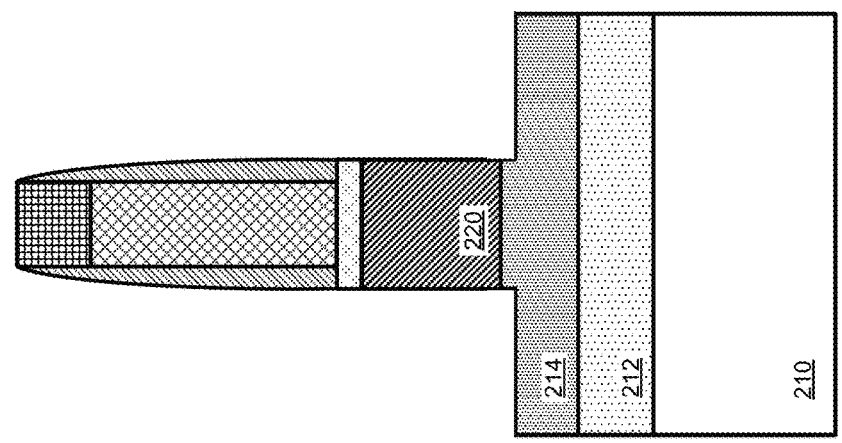
Figure 2D:
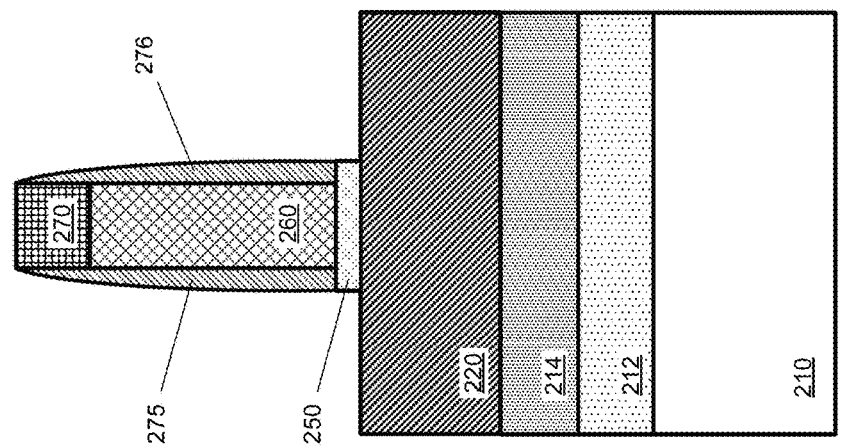
Figure 2I:
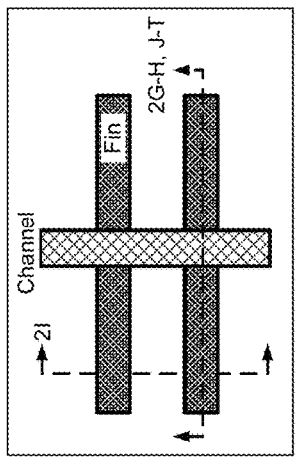
Figure 2I:
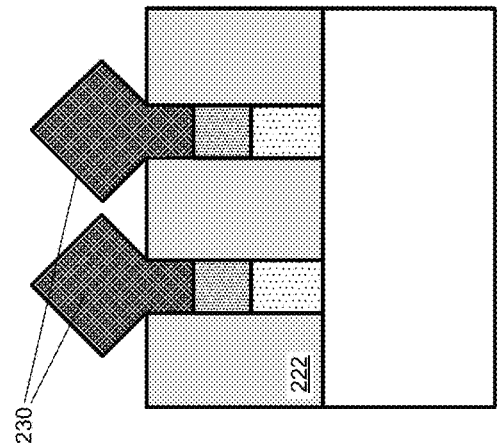
Figure 2H:
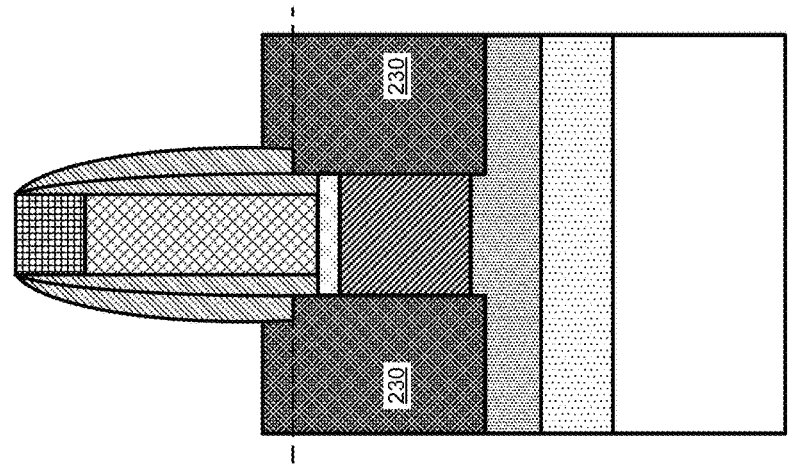
Figure 2G:
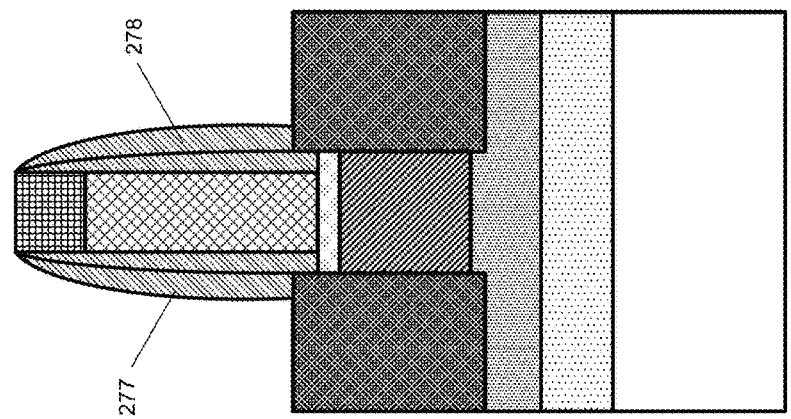
Figure 2L:
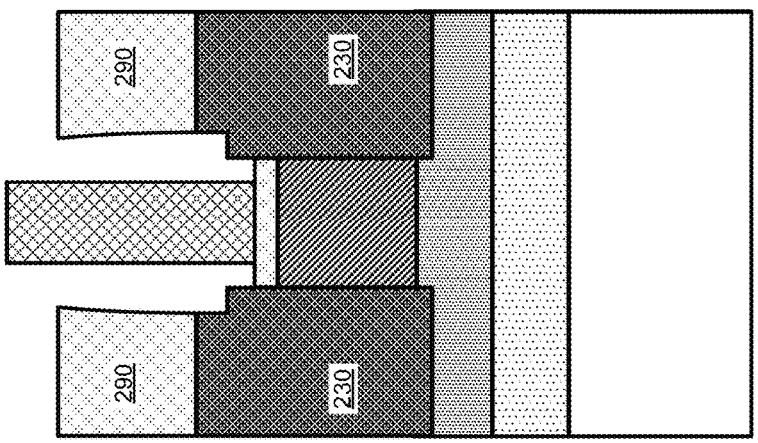
Figure 2K:
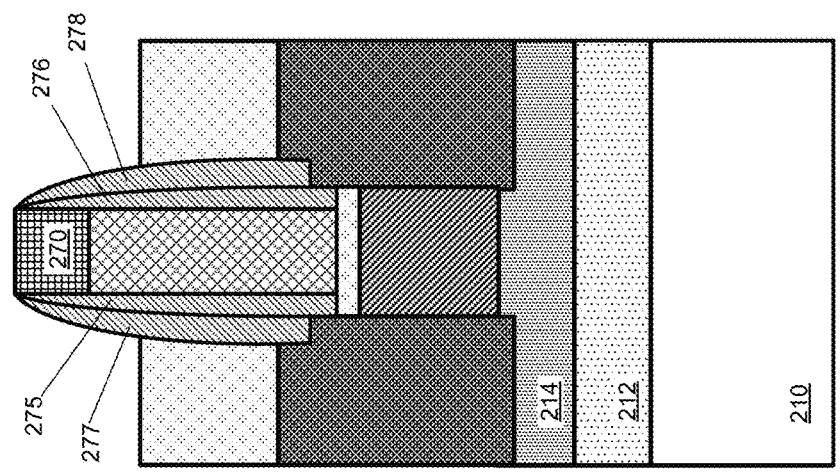
Figure 2J:
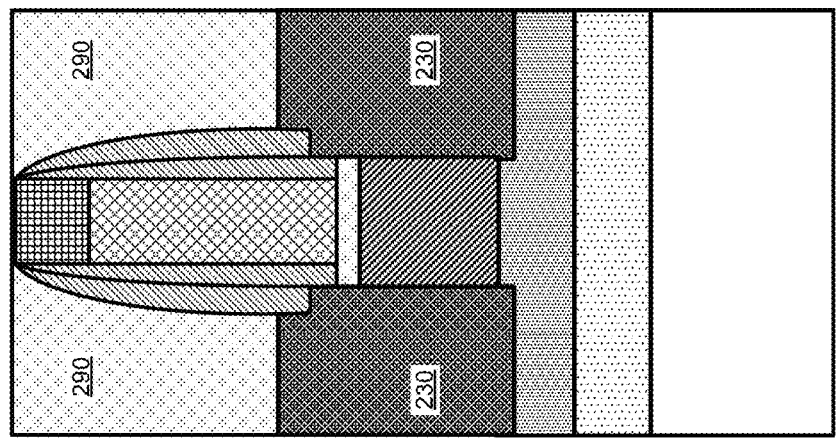
Figure 2O:
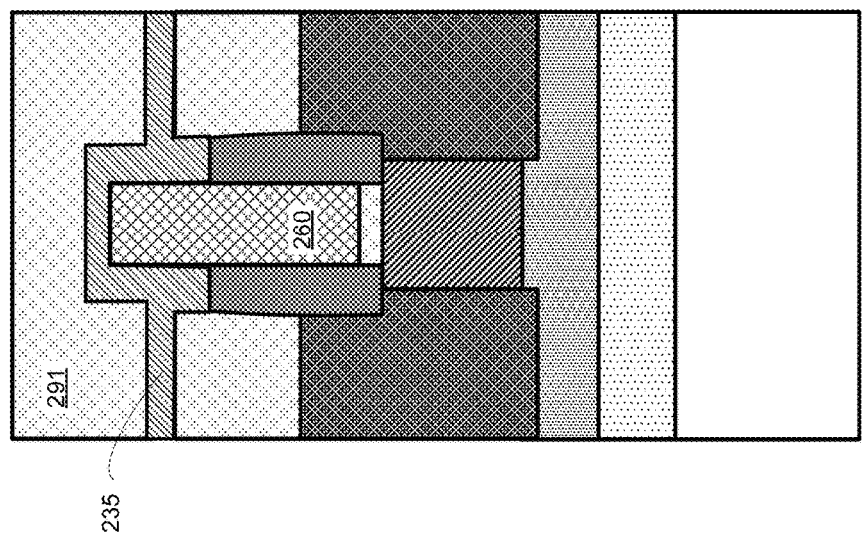
Figure 2N:
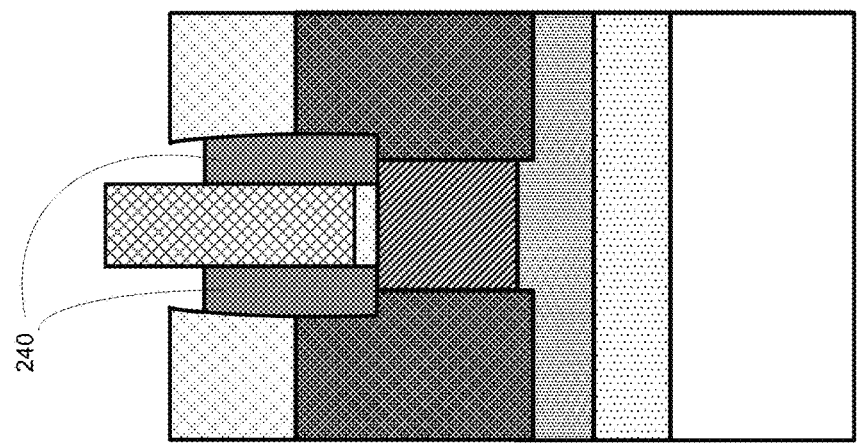
Figure 2M:
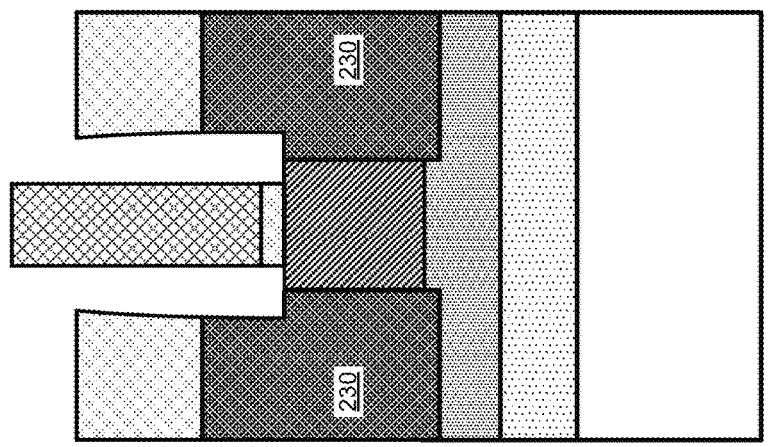
Figure 2R:
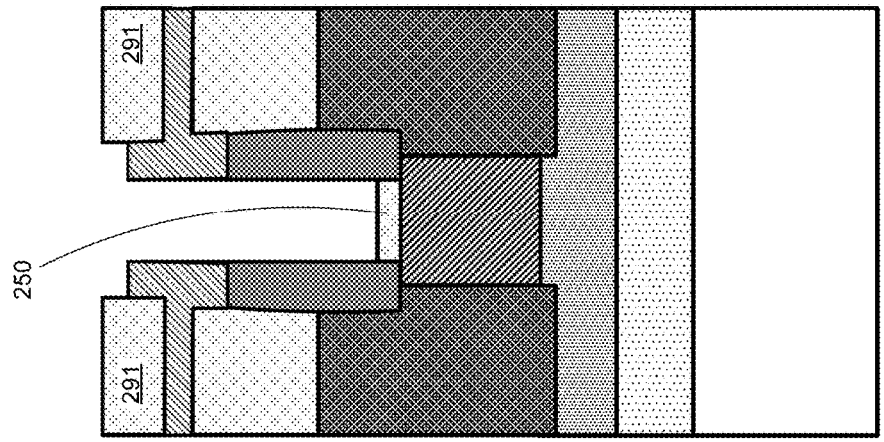
Figure 2Q:
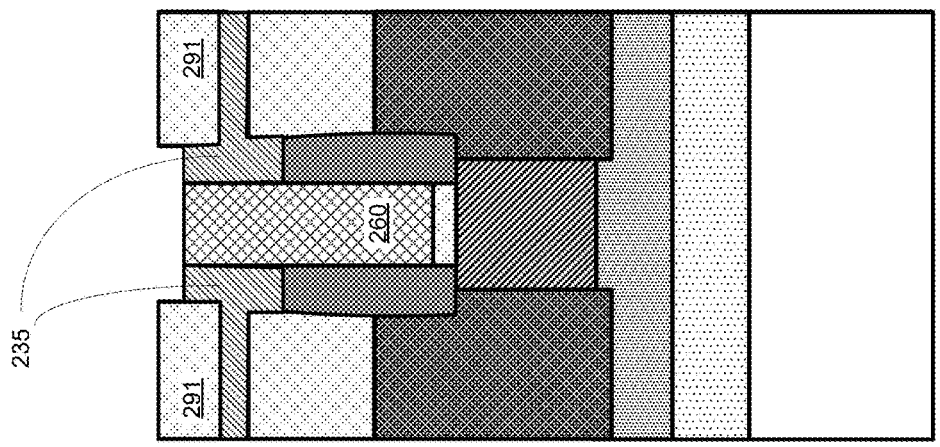
Figure 2P:
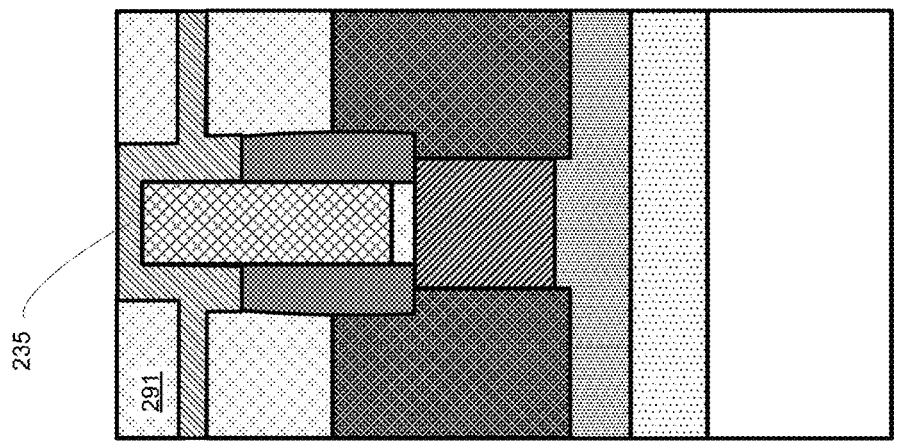
Figure 2T:
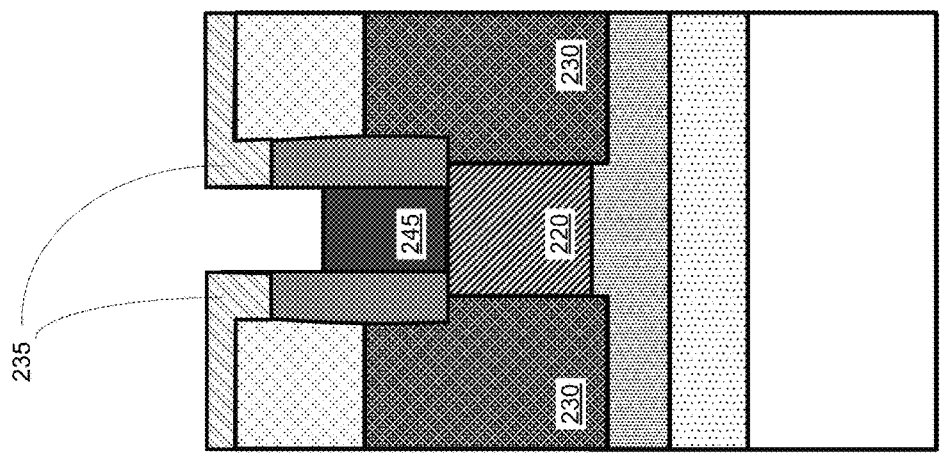
Figure 2S:
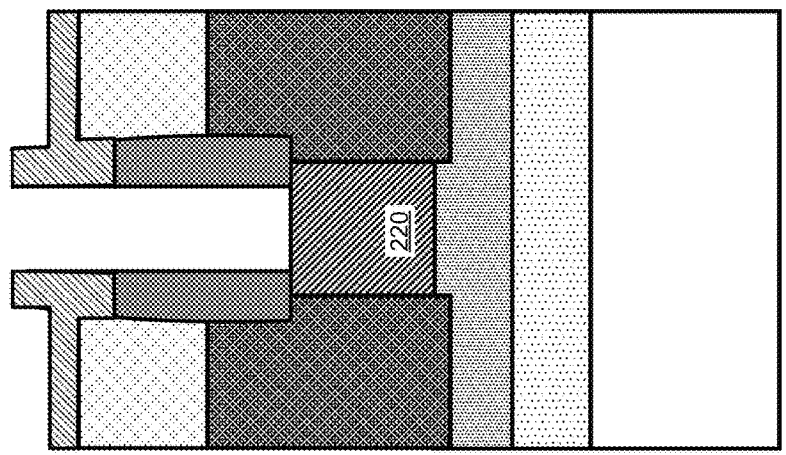
Figure 2W:
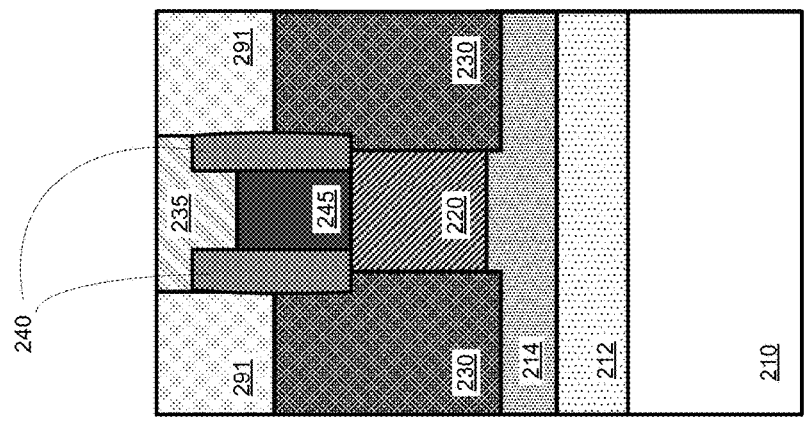

FIGS. 2A-2W depict process steps that may be used to fabricate a finFET having reduced resistance regions at source/drain junctions, according to some embodiments. The reduced resistance regions may be referred to as source/drain extension regions. A process for forming a finFET having reduced resistance regions may begin with a substrate 210, upon which a fin comprising layers 212, 214 and 220 have been formed, as depicted in FIG. 2A. In some embodiments, the substrate may comprise a bulk semiconductor substrate 210 of a first type of semiconductor material. The bulk substrate 210 may be any suitable semiconductor (e.g., Si, Ge, GaAs, InP, GaN, SiC, etc.) in some embodiments, or may be a material other than a semiconductor in other embodiments. The substrate may comprise a crystalline semiconductor having a standard orientation of crystal planes, or may have any selected rotated orientation (e.g., (110)).

In the example of FIG. 2A, the substrate 210 includes at least one fin formed from layers 212, 214 and 220, which comprise buffer layer 212, defective region 214 and defect free fin 220. As shown in the inset FIG. 2A', the fin may be formed over a portion of the substrate, and multiple fins may be formed on the substrate. According to some embodiments, a fin may be formed by a heteroepitaxial process that includes depositing a buffer layer 212 onto the substrate to provide a suitable surface for subsequent formation of the fin material. The buffer layer may be epitaxially grown over the substrate 210, according to some embodiments. In other embodiments, the buffer layer may be formed by other suitable deposition processes (e.g., atomic layer deposition, plasma deposition, sputtering) and may not be of low-defect crystalline quality. Defective region 214 and defect free fin 220 may be formed of the same material, or may be formed from different materials. For example, defective region 214 and defect free fin 220 may be formed by epitaxially growing a single material onto the buffer layer 212, and the defective region 214 may represent a region between the buffer layer and the fin layer in which defects form as a result of lattice mismatch between the buffer layer and the fin material. In some embodiments, fin 220 comprises a III-V semiconductor and substrate 210 comprises bulk silicon. The fin layer may comprise any suitable semiconductor, such as but not limited to, GaAs, InP, GaN, SiC, SiGe, etc. In some embodiments, a buffer layer 212 may not be used. Instead, a layer of material for the fin may be epitaxially grown directly on the substrate. For example, SiGe may be grown directly on a bulk Si substrate. In some implementations, an insulating buried oxide layer may be located below the buffer layer 212 or defect region 214.

Irrespective of whether the buffer layer is used, the fin(s) may be formed (e.g., on the substrate or buffer layer) by any suitable process (e.g., using sidewall image transfer (SIT) techniques, a mandrel process, lithographically patterning a resist and etching portions of the substrate to form the fin(s), or by patterning and etching trenches and depositing semiconductor material in the trenches to form the fins). In some implementations, lithographic patterning may be done using extreme ultraviolet (EUV) lithography. According to some embodiments, the layers of the fins may be formed by epitaxial growth within narrow trenches. The narrow trenches may be patterned in a layer of material (e.g., an oxide layer 222 as depicted in FIG. 2I) using EUV lithography techniques. In some implementations, a modified mandrel process may be used to form trenches or a mask for etching trenches in which to form the layers of the fins. The trenches may serve as a mold in which the layers of the fins may be epitaxially grown. According to some embodiments, defects in the defect region 214 terminate during epitaxial growth, because of the narrowness of the trenches. After the layers of the fins are formed, the layer of material in which the fins are formed may be etched back to reveal at least the semiconductor fin layer 220, according to some embodiments.

In FIG. 2B, material for a dummy gate may be formed over the fin, comprising an insulating layer 250, dummy gate conductor 260 and a mask layer 270. In some embodiments, insulating layer 250 comprises an oxide. In some embodiments, mask layer 270 comprises $SiN_x$, and is used to pattern the gate conductor. Any suitable material may be used for the mask layer 270. The dummy gate conductor 260 may comprise polysilicon, according to some implementations, though any suitable material may be used. In various embodiments, the mask layer 270 exhibits etch selectivity over the dummy gate conductor 260, and the dummy gate conductor exhibits etch selectivity over the insulating layer 250.

In FIG. 2C, a gate structure is formed by removing portions of the dummy gate conductor 260 and the mask layer 270. For example, photolithography may be used to pattern a resist over the mask layer 270 and define the gate patterns. After the resist is patterned, the gate patterns may be transferred to the mask layer 270 by etching (e.g., using an anisotropic reactive ion etch). A subsequent etch may be used to remove material of the dummy gate conductor 260, but not the insulating layer 250, as depicted in FIG. 2C. In some embodiments, an additional etch may be used to selectively remove the insulating layer 250 in regions not masked by the dummy gate conductor.

A first spacer layer may then be deposited over the fins and gate structure, according to some embodiments. The first spacer layer may be deposited in a conformal deposition process, e.g., by a chemical vapor deposition (CVD) process. The spacer layer may then be etched back to expose the underlying oxide adjacent the dummy gate structure, and the underlying oxide may be etched away, resulting in the structure shown in FIG. 2D. First gate spacers 275 and 276 are formed on sidewalls of the dummy gate conductor 260. In some embodiments, the gate spacers 275 and 276 are formed from SiN, though any suitable material may be used. In some embodiments, the thickness of the first spacer layer, and approximate thickness of spacers 275 and 276, is between approximately 1 nm and approximately 20 nm.

Referring to FIG. 2E, a timed etch may be used to remove portions of fin 220 (which may or may not also remove portions of defective region 214, as shown in the figure). In some embodiments, the removed regions of the fin 220 represent source and drain regions of the fin. Because the fins were formed by epitaxial growth in trenches, removal of the source and drain regions results in re-opening the trenches at the source and drain regions.

With reference to FIG. 2F, a highly doped semiconductor 230 may be epitaxially grown in the regions from which fin 220 was removed in FIG. 2E. In some embodiments, the highly doped semiconductor comprises a III-V semiconductor, such as InAs or GaAs, and may or may not be of the same composition as the original fin 220. By replacing source and drain portions of fin 220 with a semiconductor composition having a higher dopant concentration than the material of fin 220, the finFET may be fabricated to have reduced resistance regions at the source and drain. Additionally, because the first spacer layer is thin, the source and drain junctions can be precisely located close to the channel region of the finFET, which also leads to lower resistance at the source and drain junctions. In some embodiments, a dopant species may be introduced during epitaxial regrowth to obtain high doping concentrations at the regrown source and drain regions. In some implementations, the highly doped epitaxial regions have a doping level between $10^{16}$ dopants/cm$^3$ and $10^{21}$ dopants/cm$^3$. In some implementations, the highly doped epitaxial regions have a doping level between $10^{17}$ dopants/cm$^3$ and $10^{20}$ dopants/cm$^3$. In some implementations, the highly doped epitaxial regions have a doping level between $10^{18}$ dopants/cm$^3$ and $10^{21}$ dopants/cm$^3$.

In FIG. 2G, second gate spacers 277 and 278 may be formed in contact with gate spacers 275 and 276, respectively. According to some embodiments, the second gate spacers may be formed of a same composition as the first gate spacers and by a same process used to form the first gate spacers. In some embodiments, the gate spacers 277 and 278 are formed from SiN. As shown by the remaining steps of the fabrication process depicted in FIGS. 2A-2W, a size of the gate spacers 275 and 276 may determine the extent to which the semiconductor composition 230 approaches the edge of the gate conductor. Accordingly, the distance between the regrown source and drain regions 230 and the channel region (directly below the gate conductor) can be predetermined very precisely by selecting a thickness of the first spacer layer that is used to form spacers 275, 276.

Referring to FIGS. 2H-2I and according to some embodiments, the layer of material 222 in which the fins are formed may be etched back to reveal at least an upper portion of the fin, and the semiconductor composition 230 may be further epitaxially grown beyond the height shown in FIG. 2G (shown as a dashed line in FIG. 2H). A resulting fin cross-sectional profile is depicted in FIG. 2I. The epitaxial growth pattern may depend upon the crystal orientation at the fin. Increasing the surface area of the regrown source and drain regions 230 may, for example, reduce contact resistance at the source and drain regions. In some embodiments, the regrown regions may include an even higher dopant concentration to further reduce contact resistance. FIG. 2I shows an alternate view of the structure shown in FIG. 2H; the orientation of the view in FIG. 2I is depicted in the inset FIG. 2I'. Semiconductor composition 230 has been formed to a raised source or drain region, as shown in FIG. 2I (each raised section of semiconductor composition 230 depicts either a source or a drain region, since each represents one side of one fin structure).

In some embodiments, a planarizing layer 290 may formed over the fins and subsequently planarized (e.g., using chemical-mechanical planarization) to the height of mask layer 270, as depicted in FIG. 2J. The planarization layer 290 may, for example, provide protection of the raised source/drain regions 230 shown in FIG. 2I through the remaining steps in the fabrication process. The planarization layer may, according to some embodiments, be formed of an oxide, though any suitable material may be used. According to some embodiments, after deposition, the planarization layer 290 may be etched or polished back (e.g., using chemical-mechanical polishing (CMP)) to the residual mask layer 270 which may, in some cases, provide an etch stop for the polishing step.

According to some embodiments, planarization layer 290 may be recessed to reveal an upper portion of the gate structure, as depicted in FIG. 2K. The planarization layer may be recessed using any suitable etching process, for example using a timed reactive ion etch process.

In order to replace the gate spacers 275-278 and the dummy gate conductor 260, as described below, the mask layer 270 and gate spacers 275-278 are first removed, as depicted by FIG. 2L. These portions of the structure may be remove by a process such as by an etch process configured to remove those portions without removing portions of the semiconductor composition 230, planarization layer 290 or insulating layer 250. According to some embodiments, the gate spacers may be removed by a selective dry etch and/or by a selective wet etch. Any suitable etchant may be used that preferentially etches the spacer material.

Portions of the regrown source and drain regions 230 and insulating layer 250 may be removed, as shown in FIG. 2M. For example, a timed anisotropic etch may be used to etch back a portion of the regrown source and drain regions near the insulating layer 250. A second etch may be used to etch back exposed regions of the insulating layer 250 adjacent the dummy gate conductor 260. These etches may, in some implementations, be used to reduce parasitic capacitance of the finFET. The etch used to remove exposed regions of the insulating layer 250 in FIG. 2M may, or may not, remove a portion of the planarization layer 290.

A replacement spacer 240 may be formed using a low-k material, such as within the regions previously occupied by gate spacers 275-278, as shown in FIG. 2N. In some embodiments, the replacement spacer 240 comprises SiBCN and/or SiOCN. Formation of the replacement spacer 240 may include forming the low-k material over the gate and planarization layer 290, planarizing the low-k material (e.g., by a CMP step), and subsequently etching back the replacement spacer (e.g., by a timed etch) to the configuration shown in FIG. 2N.

A liner layer 235 and a planarization layer 291 may be formed over the replacement spacer and dummy gate conductor 260, as shown in FIG. 2O. In some embodiments, the liner layer comprises $SiN_x$. Liner layer 235 may be formed by a deposition process, e.g., by any suitable CVD process or a physical deposition process. The planarization layer 291 may be formed by a physical deposition process, or a chemical deposition process. In some embodiments, liner layer 235 may be formed by atomic layer deposition. Planarization layer 291 may be planarized by CMP after deposition, according to some embodiments.

In partial preparation to remove the dummy gate conductor 260, the planarization layer 291 may be etched or polished back to expose the liner layer 235 above the dummy gate conductor, as shown in FIG. 2P. In some implementations, the planarization layer 291 may be planarized (e.g., using chemical-mechanical planarization) using the liner layer 235 as a stop layer. In some implementations, a timed etch may be used.

The exposed portion of the liner layer 235 is removed from above the dummy gate conductor 260, thus exposing the dummy gate conductor as shown in FIG. 2Q. The exposed liner layer may be removed by a timed reactive ion etch, for example. The dummy gate may then be removed as shown in FIG. 2R. The planarization layer 291 and the insulating layer 250 may then be removed, such as by an etch configured to target the materials comprised by those layers, as shown in FIG. 2S. The etches to remove the dummy gate and insulating layer 250 may be dry etches or wet etches. In some embodiments, less than all of the planarization layer 291 may be removed.

A gate insulator may then be formed at the gate locations on the fins 220. Any suitable gate insulator may be formed by any suitable process. In some implementations, the gate insulator is formed of high-k dielectric. For example, a gate oxide (e.g., silicon dioxide) may be deposited by atomic layer deposition or a thermal oxidation process.

Referring to FIG. 2T, a gate conductor 245 may be formed in place of the removed dummy gate. In some embodiments, the gate conductor 245 comprises a high conductive material, such as, but not limited to, tungsten or a tungsten silicide. The gate conductor may be deposited by a physical or vapor deposition process over the region of the gate, and subsequently etched back by a CMP step, according to some embodiments. Additional liner material 235 may then be formed above the gate 245, and the structure planarized, as shown in FIGS. 2U-W.

Figure 2V:
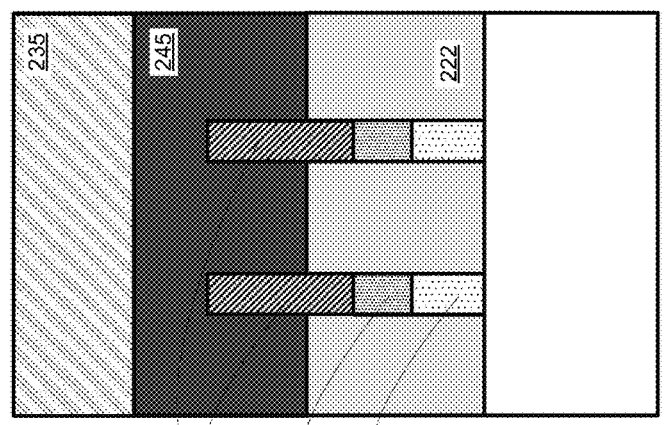
Figure 2U:
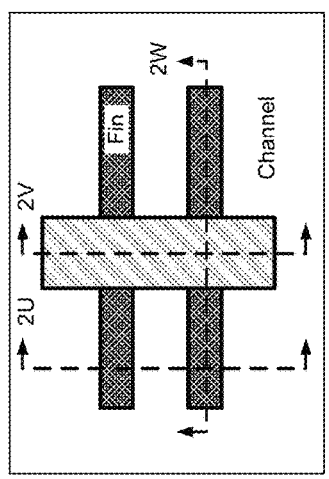
Figure 2U:
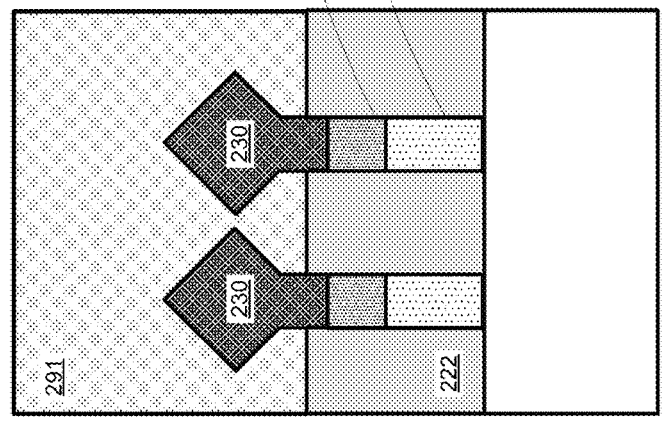

FIGS. 2U-W depict three different cross-sections of the structure shown in the inset of FIG. 2U'. Note the source and drain regions of the fin that comprise the semiconductor composition 230 extend into the region below the gate/ spacer of the finFET and approach the edge of the channel. Since the semiconductor composition is formed from a highly doped material, this increases conductivity in the region beneath the gate and/or spacer and correspondingly leads to a reduced resistance of the device in operation.

Although the foregoing methods and structures are described in connection with "finFETs," the methods and structures may be employed for variations of finFET devices in some embodiments. For example, according to some implementations, the methods and structures may be employed for the fabrication of tri-gate, pi-gate, or omega-gate transistors. In some embodiments, the methods and structures may be employed for the fabrication of gate-all-around (GAA) transistors.

Further, although the exemplary fabrication process depicted in FIGS. 2A-2W illustrate a "gate last" approach, it will be appreciated that a "gate first" approach may be employed as the invention is not limited to any particular techniques for producing the gate structure depicted in FIGS. 2U-W. In a gate first approach, the spacers may or may not be replaced.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings depict one or a few transistor structures, it will be appreciated that a large number of transistors can be fabricated in parallel following the described semiconductor manufacturing processes. The transistors may be incorporated as part of microprocessing or memory circuitry for digital or analog signal processing devices. The transistors may be incorporated in logic circuitry, in some implementations. The transistors may be used in consumer electronic devices such as smart phones, computers, televisions, sensors, microprocessors, microcontrollers, field-programmable gate arrays, digital signal processors, application specific integrated circuits, logic chips, analog chips, and digital signal processing chips.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of forming a FinFET, the method comprising:
   forming a fin on a semiconductor substrate, the fin having a first semiconductor composition;
   covering a region of the fin with an insulating layer and a dummy gate structure on the insulating layer;
   forming a first gate spacer above the fin and on the insulating layer;
   removing portions of the fin, the covered region of the fin forming, under the dummy gate structure, a channel region having a uniform width and substantially straight sidewalls for its entire height;
   forming source and drain regions by forming a second semiconductor composition in direct abutting contact with the first semiconductor composition and with side surfaces of the insulating layer; and
   forming a second gate spacer in contact with the first gate spacer.

2. The method of claim 1, wherein the second gate spacer extends over the second semiconductor composition.

3. The method of claim 1, wherein at least one of the first gate spacer and the second gate spacer comprises $SiN_X$.

4. The method of claim 1, further comprising replacing the first gate spacer and the second gate spacer with a low-k dielectric material.

5. The method of claim 4, wherein the low-k dielectric material includes one or more of SiBCN or SiOCN.

6. The method of claim 1, wherein a width of the fin is between approximately 3 nm and 20 nm.

7. The method of claim 1, wherein one or more of the first and second semiconductor compositions is a III-V semiconductor.

8. The method of claim 1, further comprising forming the second semiconductor composition by epitaxial growth.

9. The method of claim 1, further comprising doping the second semiconductor composition to form a higher conductivity material than the first semiconductor composition.

10. The method of claim 9, wherein the second semiconductor composition has a doping concentration between $10^{18}$ dopants/cm$^3$ and $10^{21}$ dopants/cm$^3$.

11. The method of claim 1, wherein the first semiconductor composition is undoped.

12. The method of claim 1, further comprising replacing the dummy gate and the oxide layer with a metal gate and a high-k dielectric layer, respectively.

13. The method of claim 1 wherein the fin includes one or more of a buffer layer and a substantially defect-free layer.

14. The method of claim 1 wherein the substrate includes a buried oxide layer.

15. A method, comprising:
    forming, on a semiconductor substrate, a multi-layer fin including a top layer having a first semiconductor composition;
    covering a portion of the fin with a dummy gate structure;
    forming a first gate spacer on the fin, the first gate spacer abutting side surfaces of the dummy gate structure;
    removing exposed regions of the top layer, using the dummy gate structure as a mask, the covered portion of the fin forming a channel region under the dummy gate structure;
    replacing the removed exposed regions of the top layer with a second semiconductor composition to form source and drain regions, the second semiconductor composition in direct abutting contact with the first semiconductor composition and with outer sidewalls of the first gate spacer;
    forming a second gate spacer on the source and drain regions, the second gate spacer in direct abutting contact with the outer sidewalls of the first gate spacer; and
    replacing the dummy gate structure with a metal gate structure.

16. The method of claim 15 wherein replacing the dummy gate structure includes:
    forming a high-k gate dielectric over the channel region;
    forming a metal gate; and
    forming replacement spacers covering sidewalls of the metal gate.

17. The method of claim 15 wherein the second semiconductor composition has a higher conductivity than the first semiconductor composition.

18. The method of claim 15 wherein the second semiconductor composition is epitaxial.

19. The method of claim 15 wherein the second semiconductor composition is substantially defect-free.

20. The method of claim 16 wherein the replacement spacers extend vertically beyond a top surface of the metal gate.

21. A method of forming a FinFET, the method comprising:
    forming a fin on a semiconductor substrate, the fin having a first semiconductor composition and including source and drain regions;
    covering a region of the fin with a dummy gate structure;
    forming a first gate spacer above the fin, the gate spacer having outer sidewall surfaces;
    removing at least a portion of the source and drain regions of the fin, a remaining portion of the fin forming, under the dummy gate structure, a channel region having sidewalls aligned with the outer sidewall surfaces of the gate spacer;
    forming, in the source and drain regions, a second semiconductor composition in direct abutting contact with the first semiconductor composition; and
    forming a second gate spacer in contact with the first gate spacer.

22. The method of claim 21, wherein the sidewalls of the channel region are substantially straight.

23. The method of claim 22, wherein the removing entails use of an anisotropic etching process to produce the substantially straight sidewalls.

* * * * *